United States Patent
Bharadwaj et al.

(10) Patent No.: US 7,058,910 B2
(45) Date of Patent: Jun. 6, 2006

(54) INVARIANT CHECKING METHOD AND APPARATUS USING BINARY DECISION DIAGRAMS IN COMBINATION WITH CONSTRAINT SOLVERS

(75) Inventors: Ramesh Bharadwaj, Alexandria, VA (US); Steve Sims, Arlington, VA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 464 days.

(21) Appl. No.: 10/180,043

(22) Filed: Jun. 27, 2002

(65) Prior Publication Data

US 2004/0006451 A1 Jan. 8, 2004

(51) Int. Cl.
*G06F 17/50* (2006.01)
(52) U.S. Cl. .................................. 716/5; 716/4; 716/7
(58) Field of Classification Search .................... 716/3, 716/7, 4, 5; 703/2
See application file for complete search history.

(56) References Cited

U.S. PATENT DOCUMENTS

| | | | | |
|---|---|---|---|---|
| 5,390,325 | A | * | 2/1995 | Miller .......................... 714/38 |
| 5,481,717 | A | | 1/1996 | Gaboury |
| 5,513,122 | A | | 4/1996 | Cheng et al. |
| 5,652,835 | A | * | 7/1997 | Miller .......................... 714/38 |
| 5,680,332 | A | * | 10/1997 | Raimi et al. ................... 703/13 |
| 5,752,000 | A | | 5/1998 | McGeer et al. |
| 5,910,897 | A | | 6/1999 | Dangelo et al. |
| 5,987,252 | A | | 11/1999 | Leino et al. |
| 6,026,222 | A | * | 2/2000 | Gupta et al. .................... 716/5 |
| 6,131,078 | A | | 10/2000 | Plaisted |
| 6,212,669 | B1 | * | 4/2001 | Jain .............................. 716/7 |
| 6,275,976 | B1 | | 8/2001 | Scandura |
| 6,728,665 | B1 | * | 4/2004 | Gupta et al. .................... 703/2 |

OTHER PUBLICATIONS

Bharadwaj et al, Salsa: Combining Constraint Solvers with BDD'S for Automatic Invariant Checking, in Proc. Tools and Algorithms for the Construction and Analysis of Systems, (TACAS 2000). Lecture Notes in Computer Science, Springer, pp. 1-16.

* cited by examiner

*Primary Examiner*—A. M. Thompson
*Assistant Examiner*—Brandon Bowers
(74) *Attorney, Agent, or Firm*—John J. Karasek; L. George Legg (57) ABSTRACT

An invariant checking method and apparatus using binary decision diagrams (BDDs) in combination with constraint solvers for determining whether a system property is an invariant of a system description. The invariant checking method receives system descriptions and system properties and transforms them into a model formula. Specific variables are eliminated from the model formula and a corresponding output formula is generated. The output formula is transformed into a logic formula by substituting a new logic variable for each integer constraint in the output formula. A constrained BDD is constructed from the logic formula. The constrained BDD uses a heuristic algorithm to order the logic variables in the paths leading to true or false. A constraint solver is applied to the integer constraints that correspond to the occurrences of logic variables in the BDD paths, which determines whether the system property is or is not an invariant of the system description.

13 Claims, 1 Drawing Sheet

FIG. 1

INVARIANT CHECKING METHOD AND APPARATUS USING BINARY DECISION DIAGRAMS IN COMBINATION WITH CONSTRAINT SOLVERS

FIELD OF THE INVENTION

This present invention relates to the automated analysis of systems, and more particularly, to an improved checking method for use in such analysis.

BACKGROUND OF THE INVENTION

Given the complex nature of, and the time consumed in analyzing hardware and software systems, there is an increasing need to provide debugging aids and diagnostic information which can be used to locate errors and ensure the correctness or verification of such systems.

Model checking has emerged as an effective technique for the automated analysis of software and hardware systems. Model checkers can analyze a system description automatically and provide a counterexample as feedback to the system designers. However, when analyzing software system descriptions, solely implementing a model checker for a complex problem rarely succeeds. As an alternative, theorem proving also affords an interesting approach. Conventional theorem proving systems, however, are often too general or too expensive to use in a practical setting because they require considerable user sophistication, human effort and system resources. Further, conventional theorem provers alone provide little or no diagnostic information when a theorem is not true.

One attempt to provide formal verification of systems is described in U.S. Pat. No. 5,481,717 to Gaboury. The Gaboury patent discloses a method for verifying a computer program in relation to a system specification. The implementation and specifications are translated to two finite state machine representations that are compared to each other in order to determine whether there exists an equivalence between internal states and values of the two finite state machine descriptions and whether said finite state machine descriptions produce equivalent respective output values for all equivalent input values. In accomplishing this verification method, Gaboury uses a method that is an extension of an existing Binary Decision Diagram (BDD). However, this approach has limited use in analyzing systems that contain integer constraints.

Another prior technique that provides formal verification of systems is an invariant checking method that combines binary decision diagrams (BDDs) with constraint solvers. This technique has the attributes of both a model checker and a theorem prover. The technique is automatic and provides counterexamples like the model checker, and like a theorem prover, the invariant checking method uses decision procedures and can handle infinite state systems. However, this invariant checking method does not provide for the efficient construction of a BDD in which the BDD employs optimized algorithms for obtaining optimal variable ordering. The prior art invariant checking method is described in Ramesh Bharadwaj and Steve Sims, "*Salsa: Combining Constraint Solvers with BDDs for Automatic Invariant Checking*, "TACAS 2000, which is hereby incorporated by reference.

Further prior art techniques use BDDs as a structure to represent a formula in propositional logic, i.e., logic that only involves variables of the boolean type. Such BDDs are only able to determine whether or not a formula, with only variables of boolean type, is always true or always false, and such techniques are unable to determine the truth or falsity of more complex formulas which may include variables of more complex types, such as, enumerations and integers in addition to boolean type. However, these conventional techniques determine variable ordering serendipitously or by random assignment and do not use optimized algorithms to obtain optimal variable ordering.

SUMMARY OF THE INVENTION

The present invention has the advantage of reducing processing time and gaining efficiency by constructing a constrained BDD that employs optimized algorithms for obtaining a good ordering of variables. One optimized algorithm can be a heuristic algorithm. The constrained BDD has the advantage of being able to represent not only variables of a boolean type but also to accommodate integer constraints, i.e. predicate logic formulas.

Another advantage of the constrained BDD technique of the present invention is the ability to determine the truth or falsity of a complex formula that not only involves variables of a boolean type but also involves integer variables and liner constraints. As will appear from the discussion below, the invention combines the constrained BDD with constraint solvers in a manner which enables the handling of infinite state systems while combating the state explosion problem.

In accordance with the present invention, an invariant checking method is provided for determining whether a system property is an invariant of a system description, said method comprising the steps of: receiving a system description and a system property; transforming said system description and said system property into a model formula comprising variables; eliminating enumerated variables from said model formula and providing a corresponding output formula comprising zero or more integer constraints and residual variables remaining after eliminating said enumerated variables; partitioning said output formula into zero or more integer constraint subsets and into a logic formula by assigning a new logic variable for each of said zero or more integer constraints in said output formula; using a constrained binary decision diagram which is constructed from said logic formula using a heuristic algorithm to provide ordering of said logic variables, said constrained binary decision diagram having at least a true path or a false path, each path comprising said ordering of said logic variables; applying a constraint solver to at least one of said integer constraint subsets corresponding to said ordering of said logic variables within said true path; and determining said system property is not an invariant of the system when said at least one of said integer constraint subsets is satisfiable.

Preferably, the invariant checking method includes a system description comprising SCR Abstract Language specifications.

Advantageously, the receiving step comprises automatically generating said system property from said system description and determining whether said system property is consistent with said system description.

Advantageously, the eliminating step comprises encoding enumerated variables as boolean variables and said applying step comprises constructing an automaton for said at least one of said integer constraint subsets corresponding to said ordering of said logic variables within said true path to determine whether said at least one of said integer constraint subsets is satisfiable.

Advantageously, said determining step comprises generating a counterexample when said system property is not an invariant of the system description, said counterexample comprising a set of values assigned to variables in said model formula.

Preferably, the invariant checking method further comprises analyzing said counterexample in order to modify at least said system description or said system property.

Advantageously, the invariant checking method comprises redetermining whether said system property is not an invariant of a modified system description and redetermining whether a modified system property is not an invariant of said system description and redetermining whether said modified system property is not an invariant of said modified system description and whether said system property is an invariant of the system description when all of said zero or more integer constraint subsets is not satisfiable.

In accordance with a further aspect of the invention, there is provided in a computer system comprising a processor, I/O control circuitry, an input unit, an output unit, a memory coupled to the processor, and a computer readable medium containing instructions which when executed by the processor causes the computer system to implement an invariant checking method, said computer system performs the steps of: receiving a system description and a system property; transforming said system description and said system property into a model formula comprising variables; eliminating enumerated variables from said model formula and providing a corresponding output formula comprising zero or more integer constraints and residual variables remaining after eliminating said enumerated variables; partitioning said output formula into zero or more integer constraint subsets and into a logic formula by assigning a new logic variable for each of said zero or more integer constraints in said output formula; using a constrained binary decision diagram which is constructed from said logic formula using a heuristic algorithm to provide ordering of said logic variables, said constrained binary decision diagram having at least a true path or a false path, each path comprising said ordering of said logic variables; applying a constraint solver to at least one of said integer constraint subsets corresponding to said ordering of said logic variables within said true path; and determining said system property is not an invariant of the system when said at least one of said integer constraint subsets is satisfiable.

In accordance with another aspect of the invention, there is provided an invariant checking apparatus for determining whether a system property is an invariant of a system based on system input descriptions, said invariant checking apparatus comprising: an input section for receiving a system description and a system property; a processor for performing the steps of: transforming said system description and said system property into a model formula comprising variables; eliminating enumerated variables from said model formula and providing a corresponding output formula comprising zero or more integer constraints and residual variables remaining after eliminating said enumerated variables; partitioning said output formula into zero or more integer constraint subsets and into a logic formula by assigning a new logic variable for each of said zero or more integer constraints in said output formula; using a constrained binary decision diagram which is constructed from said logic formula using a heuristic algorithm to provide ordering of said logic variables, said constrained binary decision diagram having at least a true path or a false path, each path comprising said ordering of said logic variables; applying a constraint solver to at least one of said integer constraint subsets corresponding to said ordering of said logic variables within said true path; and determining said system property is not an invariant of the system when said at least one of said integer constraint subsets is satisfiable; and an output unit showing a counterexample when said system property is not an invariant of said system description.

Further features and advantages of the present invention will be set forth in, or apparent from, the detailed description of preferred embodiments thereof which follows.

DETAILED DESCRIPTION OF THE INVENTION

Figure 1:
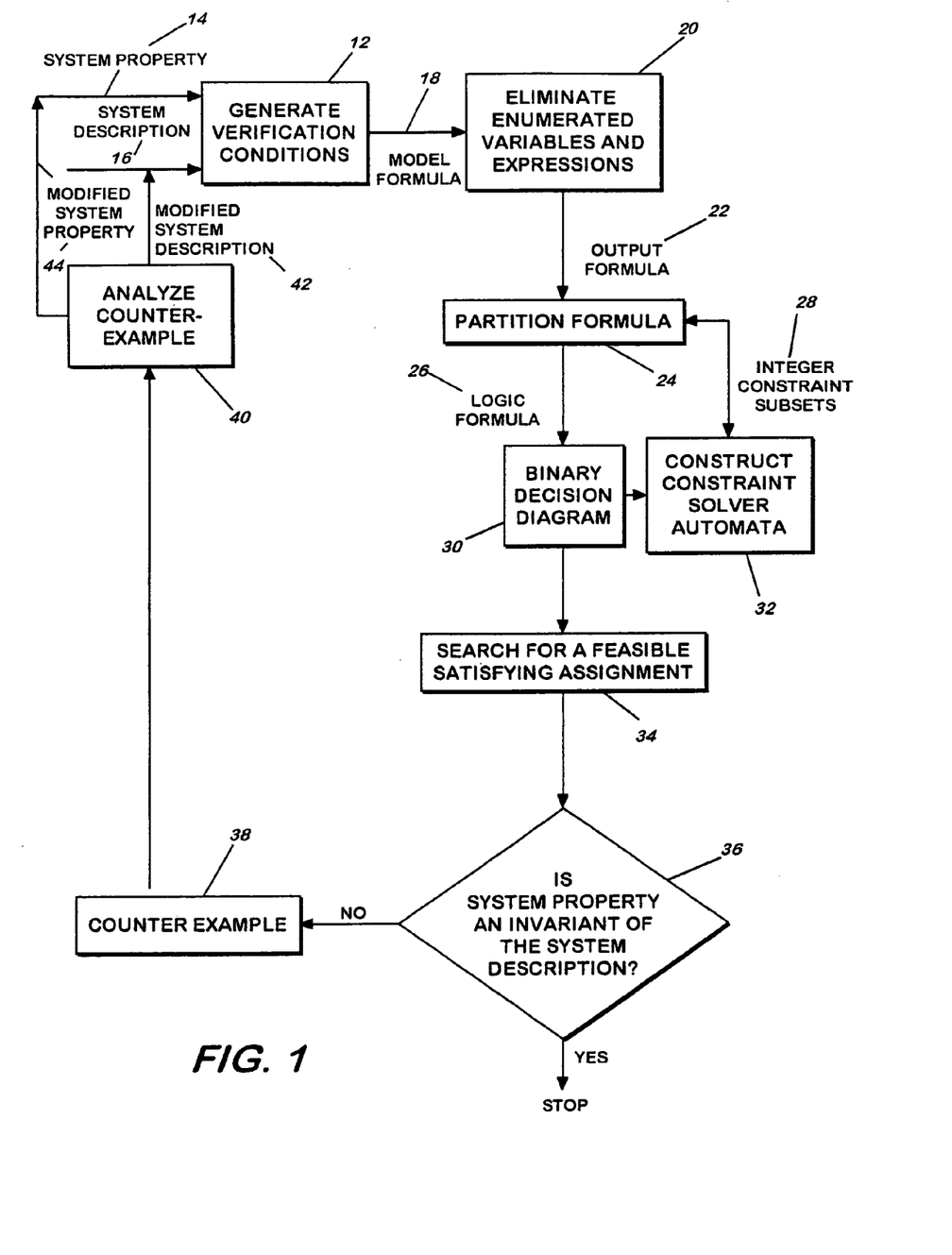
FIG. 1 is a block diagram of an automatic invariant checking method using binary decision diagrams in combination with constraint solvers, in accordance with a preferred embodiment of the invention.

Referring to FIG. 1, there is shown, in block diagram form, basic steps of the method of the invention, which is referred to herein, for shorthand purposes, as Salsa. Salsa is an automatic invariant checking method which uses integrated decision procedures for determining the consistency of at least one system property in reference to a system description and for determining whether the at least one system property is an invariant of the system description. Salsa also determines whether a model formula, which is based on a system description and at least one system property, is always true in all states the system may reach.

The automatic invariant checking method, Salsa, includes the use of a verification condition generator 12 that receives a system property 14 and a system description 16. The system description 16 is written in SCR Abstract Language specifications. The verification condition generator 12 is used to transform the system property 14 and the system description 16 into a representative model formula, represented by output 18, that includes boolean variables, integers, expressions and enumerated variables. It will be appreciated that both the system description 16 and the system property 14 can be manually entered by a user or system designer. The use of verification condition generator 12 is a mechanism for transforming an initial inquiry of whether a system property 14 is an invariant of a system description 16 into a corresponding question of whether the representative model formula 18 is always false, in light of the system description 16 and the system property 14.

It will be appreciated that rather then manually entering the system property 14, the system property 14 can also be implied, based on the kind of checks the user wishes Salsa to perform. For example, three kinds of checks that Salsa performs include the following:

1.) Lack of nondeterminism. This property implies that for a specific input from the environment, the system responds in one and only one way, i.e., that the system specification is unambiguous.

2.) No missing cases. This property implies that for each kind of input from the environment, the system specifies a response.

3.) No dead code. This property implies that each explicit case considered in the specification is possible. This property indicates that there is no redundancy in the system specification.

For each of the checks chosen by the user, the verification condition generator 12 produces at least one system property 14, which when determined to be an invariant of the system, implies that the system has satisfied the chosen check. The verification condition generator 12 automatically produces at least one system property 14 for each check selected by the user, without any user intervention or guidance. It will be appreciated that Salsa can perform other kinds of checks, in addition to those listed above.

Through an eliminating step or process indicated at 20 enumerated variables and expressions are eliminated from the model formula 18 by encoding the enumerated variables and expressions into boolean variables and thereafter providing a corresponding output formula, indicated by output 22. The output formula includes boolean variables and integer constraints.

The corresponding output formula 22 is partitioned by a partitioning step indicated by block 24 into zero or more independent integer constraint subsets 28 and into a logic formula 26. For example, the set of constraints {x<4, x>7, y<10} may be partitioned into {x<4, x>7} and {y<10}. The logic formula 26 is constructed by assigning a new logic boolean variable to each independent integer constraint. For example, the variables a can be substituted for x<4 and b for x>7.

A constrained BDD indicated by block 30 is constructed from the logic formula 26. A constrained BDD 30 is a pair <BDD, γ> where:

BDD 30 is a reduced ordered binary decision diagram. We let Vars(BDD) be the set of variables in BDD.

$\gamma \subseteq$ Vars(BDD) x $C_i$ is a partial function mapping BDD variables to integer constraints. Given a formula $\Phi$, a constrained BDD 30 is constructed that encodes $\Phi$.

Each enumerated constraint is eliminated by translating it into a Boolean formula. For each enumerated type E in $\Phi$ a one-to-one function $\Psi_E$ is defined that maps each constant in E to the binary encoding of an integer in the range 0 . . . n−1 where n is the number of constants in E. Denoting digit i of $\Psi_E(Val_e)$ as $\Psi_E(Val_e)[i]$ and letting $\Psi_E(Val_e)[0]$ be the least significant digit, for every variable x in $\Phi$ of type E there is created m Boolean variables $x_0, \ldots, x_m$ where m=$\lceil \log_2 n \rceil$ and no $x_i$ is in Vars($\Phi$). Each enumerated constraint in $\Phi$ over x is then translated into a Boolean formula according to encodeEnum:

$$encodeEnum(x = Val_e) \stackrel{def}{=} \wedge_{i=0}^{m} encodeBit(i, Val_e)$$

$$encodeEnum(x \neq Val_e) \stackrel{def}{=} \vee_{i=0}^{m} \neg encodeBit(i, Val_e)$$

$$encodeBit(i, Val_e) \stackrel{def}{=} \text{if } \Psi_E(Val_e)[i] = 1 \text{ then } x_i \text{ else } \neg x_i$$

Let $\Phi'$ be the result of eliminating enumerated constraints from $\Phi$ and let $Vars_{ea}(\Phi')$ denote the set of newly created Boolean variables used to encode the enumerated constraints of $\Phi$. By factoring out the integer constraints of $\Phi'$ creating $\Phi''$ there is yielded another set of fresh Boolean variables $Var_{ia}(\Phi'')$ each of which will encode an integer constraint. The next step is then replacing each integer constraint in $\Phi'$ by the appropriate Boolean variable or negation of a Boolean variable. Let $\overline{Varia}(\Phi'')$ denote the set of formulae $\{\neg x | x \in Var_{ia}(\Phi'')\}$. Next, there is defined an abstraction function $\alpha: C_i \to (Var_{ia}(\Phi'') \cup \overline{Varia}(\Phi''))$ mapping each constraint to an abstracted Boolean variable or its negation and a concretization function $\gamma: Var_{ia}(\Phi'') \to C_i$ mapping each abstracted Boolean variable to the integer constraint it encodes. These two functions are inverses: $\forall c \in C_i : \gamma(\alpha(c)) = c$.

We then select the BDD variable ordering. After abstracting away integer constraints we obtain a formula $\Phi''$ containing only Boolean variables, negations of Boolean variables, conjunctions, and disjunctions. Thus, the appropriate representation yields $Vars(\Phi'') = Vars_b(\Phi) \cup Vars_{ea}(\Phi') \cup Vars_{ia}(\Phi'')$. Building a BDD 30 for a formula requires selecting an ordering of the variables in the formula. Obtaining good and optimal ordering is critical and the rule of thumb is that variables affecting each other should be near one another in the ordering.

BDD variable ordering employs an optimized algorithm to provide optimal variable ordering. The optimized algorithm comprises a heuristic algorithm. In a specific, non-limiting example, the heuristic algorithm requires all variables in $Vars_b(\Phi) \cup Vars_{ea}(\Phi')$ (the top layer) to appear before all variables in $Vars_{ia}(\Phi'')$ (the bottom layer). In the top layer, monitored variables appear before internal and controlled variables and the "new" state version of a variable follows its "old" state version, i.e., x' immediately follows x. The Boolean encodings of each enumerated variable in the "old" state is interleaved with the corresponding encoding of the variable in the "new" state. In the lower layer, variables encoding constraints of the form x=x' appear first and the remaining variables are first partitioned into independent subsets using a partitioning algorithm. Each partition appears together in the ordering. Note also that the partitions appear in decreasing order of size. Although one specific algorithm is described above, it will be appreciated that BDDs can use other heuristic algorithms and methods in order to provide optimal variable ordering.

We then construct the BDD 30. After choosing a variable ordering it is straight-forward to construct a BDD 30 for $\Phi''$ using standard BDD operations. We let $BDD_{101''}$ denote the BDD thus constructed and call the pair $<BDD_{\Phi''}, \gamma>$ the constrained BDD that encodes $\Phi$.

The next step brings in the information contained in the integer constraints 28. This is done by searching for paths from the root to "True", each path yielding a set of integer constraints. We then determine whether each set is infeasible using an integer constraint solver 32.

At several times (most importantly in the routine feasible), we partition a set of integer constraints into independent subsets. We define constraint $c_1$ as being independent of constraint $c_2$ if $Vars(c_1) \cap Vars(c_2) = \Phi$. The partition of a set of constraints $CS=\{c_1, \ldots, c_n\}$ into independent subsets (denoted $\Pi(CS)$) is defined as $\Pi(CS)=\{CS_1, \ldots, CS_m\}$ such that:

1.) $\Pi(CS)$ partitions CS.

$\cup_{1 \leq i \leq m} CS_i = CS$ and $\forall i: 1 \leq i \leq m: \forall j: 1 \leq j \leq m: i \neq j \Rightarrow CS_i \cap CS_j = \Phi$ 2.) Constraints in different partitions are independent.

$\forall i: 1 \leq i \leq m: \forall c_j \in CS_i: \forall c_k \notin CS_i: vars(c_j) \cap vars(c_k) = \Phi$ 3.) For each partition containing more than one constraint, every constraint in the partition depends on some other constraint in the partition.

$\forall i: 1 \leq i \leq m: |CS_i| > 1 \Rightarrow \forall c_j \in CS_i: \exists c_k \in CS_i: c_i \neq c_k \wedge vars(c_j) \cap vars(c_k) \neq \Phi$.

We compute $\Pi(CS)$ using a union-find algorithm that starts with each constraint in its own partition and iteratively merges partitions when they contain dependent constraints. After the partitioning step 24 whereby a set of constraints are partitioned into independent integer constraint subsets 28, an integer constraint solver step 32 is used to determine the feasibility of each independent subset 28. For a set of constraints, it may be concluded that the whole set is infeasible if any independent subset is infeasible.

The constraint solver step 32 is a decision procedure that determines whether a set of integer constraints 28 is infeasible, i.e., given $\{C_1, C_2, \ldots, C_n\}$, the constraint solver 32 checks whether $C_1 \wedge C_2 \wedge \ldots \wedge C_n$ is unsatisfiable. Among several methods available for solving linear integer constraints, one approach is the use of automata theoretic methods. The idea here is to associate with each constraint an automaton accepting the solutions of the constraint. The feasibility of a set of constraints may then be computed by constructing a composite automaton from the constraint automata using the standard construction for automata intersection.

The integer constraint solver step 32 uses an algorithm that employs the following data structures:

varMap:vars(CS)→$2^{CS}$ is a hash table mapping each variable appearing in some constraint of CS to the subset of constraints in CS in which the variable occurs.

ufArray is an integer array representing the union-find data structure that will encode Π(CS) as a set of trees (each tree representing a partition). The value stored in location i of ufArray (ufArray[i]) is a "pointer" (an index to another element of ufArray) to the parent of constraint $c_i$. A negative value in ufArray[i] indicates that constraint $c_i$ roots a tree and the magnitude of the negative number indicates the number of nodes in the tree. All entries of ufArray are initialized to −1 indicating that each constraint in CS initially roots a tree containing only itself.

resArray is an array of integer sets returned by Π(CS). Each nonempty element of resArray represents the indexes of an independent partition of CS.

The primitive operations are union and find. The find operation takes an index i of a constraint $c_i$ as an argument, follows parent pointers from $c_i$ to the root of the tree in which $c_i$ appears, and returns the root's index as a result. The union operation takes two constraint indexes as arguments and merges the two trees to which the constraints belong. To reduce the depth of trees, the union operation makes the root of the input tree with fewer nodes the child of the root of the other input tree. Also for efficiency reasons, the find operation modifies all nodes on the path from its argument to the root to be children of the root.

```
fun find(i : int) = find'(i,[ ])
fun find'(i : int, visitedNodes : int list) =
    if ufArray[i] < 0
    then (
        ∀j ∈ visited Nodes : ufArray[j] := i;
        return i
    )
    else find'(ufArray[i], i :: visitedNodes)
fun union (i,j : int) =
    let
        val iRoot = find(i)
        val jRoot - find(j)
    in
        if iRoot = jRoot
        then return
        else if ufArray[iRoot] < ufArray[jRoot]
        then (         (* more nodes in i's tree *)
            ufArray[jRoot] := iRoot;
            ufArray[iRoot] := ufArray[iRoot] + ufArray[jRoot];
        )
        else (         (* more nodes in j's tree *)
            ufArray[iRoot] := jRoot;
            ufArray[jRoot] := ufArray[iRoot] + ufArray[jRoot];
        )
end
```

Given these data structures and primitive operations the partitioning algorithm is then:

```
fun Π(CS : constraint set) =
(
    (* Initialize varMap. *)
    ∀v ∈ vars(CS) : varMap[v] := 0;
    ∀c_i, ∈ CS : ∀v ∈ vars(c_i) : varMap[v] := varMap[v] ∪ i;
    (* Initialize ufArray *)
    n := number of constraints in CS;
    ∀i : 1 ≤ i ≤ n : ufArray[i] := −1;
    (* For each variable, merge partitions of
    all constraints containing the variable. *)
    ∀v ∈ varMap: ∀i ∈ varMap[v] : ∀j ∈ varMap[v] : union (i, j);
    (* Construct resArray *)
    ∀i: 1 ≤ i ≤ n: resArray[i] := 0;
    ∀i: 1 ≤ i ≤ n: resArray[find(i)] := resArray[find(i)] ∪ i;
    return resArray
)
```

We then search for a feasible satisfying assignment 34. In other words, we determine whether the system property 14 is an invariant of the system description 16 by resolving the related question of whether the model formula 18 is always true. BDDs are canonical implying that any two logically equivalent formulae will compile into the same BDD. Unsatisfiability checking for pure BDDs is therefore trivial since all BDDs except "False" are satisfiable. However, since some of the variables in a constrained BDD <$BDD_{\Phi''}$, γ> encode constraints, a non-false $BDD_{\Phi''}$ does not necessarily indicate that Φ is satisfiable. Therefore, if $BDD_{\Phi''}$ is not equal to the BDD "False", we must search for a path from the root to "True" that is feasible when the constraints encoded by γ are taken into account. We do so using a modified depth first search of the BDD. In the following pseudocode we denote a list of items $i_1, i_2, \ldots, i_n$ by $[i_1, i_2, \ldots, i_n]$ and adding item i to the head of list I is written i::I.

```
fun isFeasiblePath(<bdd, γ> : constrained BDD) = topDfs(<bdd, γ>)
fun topDfs(<bdd, γ> : constrained BDD) =
    if isFalse(bdd) then return false
```

```
            else if isTrue(bdd) then return true
            else if visited(bdd) then false
            else if var(bdd) ∈ Var_ia
                then (
                    mark Visited(bdd):
                    return bottomDfs([¬(γ(var(bdd)))], <lowChild(bdd), γ>) or
                        bottornDfs([γ(var(bdd))], <highChild(bdd), γ>)
                )
        else (
            mark Visited(bdd);
            (topDfs(<lowChild(bdd), γ>))) or (topDfs(<highChild(bdd), γ>)))
            )
fun bottomDfs(constraintList : constraint list, (bdd, γ> : constrained BDD) =
        if isFalse(bdd) then return false
        else if isTrue(bdd)
            then if feasible(constraintList) then return true
                else return false
        else if feasible (constraintList)
            then (
                bottomDfs(( ,(γ(var(bdd)))) :: constraint List, lowChild(bdd)) or
                bottomDfs((γ(var(bdd))) :: constraintList, highChild(bdd))
            )
            else return false
```

It will be recalled that the variable ordering selected placed variables in $Vars_b(\Phi) \cup Vars_{ea}(\Phi')$ before those in $Vars_{ia}(\Phi'')$. We say a BDD node whose variable is in $Vars_b(\Phi) \cup Vars_{ea}(\Phi')$ is in the top layer of the BDD 30 and nodes with variables in $Vars_{ia}(\Phi'')$ are in the bottom layer. Inspired by a pruning algorithm we optimize the search by visiting each node in the top layer only once, but explore all paths within the lower layer. This optimization is sound because only variable assignments from the bottom layer may make a path infeasible, i.e., it is not possible for the constraints associated with a constrained BDD 30 to make a path through its top layer infeasible. The topDfs routine traverses the top layer while bottomDfs traverses the bottom layer. The difference between the two routines is that topDfs marks each node as visited ensuring that each node in the top layer is visited only once; whereas, bottomDfs does not mark nodes forcing all paths in the lower layer of the BDD 30 to be explored. Note that since every node in a BDD except "False" has at least one path to "True", reversing the layers (putting the variables in $Vars_{ia}(\Phi'')$ first in the variable ordering) would make it possible to search for feasible paths without exploring those nodes with variables in $Vars_b(\Phi) \cup Vars_{ea}(\Phi')$. Since the execution time of the search is dominated by the exploration of all paths in the lower layer (which may be exponential in the size of the lower layer), we chose the current variable ordering/search strategy in order to generate a counterexample 38. The counterexample 38 is a set of values that are assigned to variables in the model formula 18.

If it is determined that the model formula 18 is always false, in other words, if no assignments to variables of the model formula 18 can ever make the model formula 18 true, then the answer to the original question of whether the system property 14 is an invariant of the system description is "yes" (block 36) and the invariant checking process is done.

However, if there is an assignment to variables in the model formula 18 that makes the model formula 18 true, then the answer to the original question of whether the system property 14 is an invariant of the system description is "perhaps not". In this situation, the invariant checking process does not merely provide the answer "perhaps not" but in addition generates a counterexample 38. The counterexample 38 gives system designers or users insight into whether or not the original question was correct, and if not, the counterexample 38 provides a hint as to how the system description 16 or the system property 14, or both, can be modified in order to get a more definitive answer.

The system designer or user analyzes 40 the counterexample 38 in terms of the system description 16 and the original system property 14 and modifies the system description 16 or the system property 14, or both, in order to determine the real answer. The modified system description 42 or the modified system property 44, or both, is reinserted into the verification condition generator 12 and the invariant checking process begins all over again to determine whether the system property 14 is an invariant of the modified system description 42 or whether the modified system property 44 is an invariant of the system description 16 or whether the modified system property 44 is an invariant of the modified system description 42.

Further understanding of the present invention is provided with reference to the following non-limiting example. Salsa is used to specify the requirements of a bomb release component of an attack aircraft. One example of an attack aircraft is the Navy's, decommissioned A7E. The subsystem being specified controls an electrical switch or button labeled "BombRelease" which operates to open the bomb bay of the aircraft and releases the bomb under the control of the pilot. Under no circumstances should the bomb be released unless the pilot has pressed the "ReleaseEnable" button on the aircraft.

Therefore, a system property that is presumed to be always true, or in other words, a system property that is an INVARIANT of the system description is the following:

(BombRelease=on)⇒(ReleaseEnable=on);

which states that if BombRelease is "on" then ReleaseEnable must necessarily be "on" for all executions of the system. If this property is proved to be true, then what we are saying is that under no circumstances will the aircraft's bomb be released without the express consent of the pilot. Therefore Salsa provides a high assurance argument in the form of a formal, mathematical proof, that the system property holds for the system and not for some executions of the system. This is all that can be concluded from conventional testing, where the truth of such a property is examined for some finite "runs" of the system. There could be other runs for which the property does not hold, but this cannot be demonstrated or refuted by conventional testing.

Proving or attempting to prove the above system property using Salsa immediately reveals a problem. The Exhibit "A", as described below, contains the system descriptions together with the system property that is to be established, for example, OriginalReleaseOK. Initially, it is important to establish well-formedness of the tables of Exhibit "A" by performing "consistency checks" on the specification. Two kinds of checks are performed, one is disjointness and the other is coverage. The disjointness check is to make sure that there is no conflicting overlapping cases. The coverage check is to make sure that there are no missing cases. For each of these checks, Salsa automatically generates a set of "verification conditions" whose invariance establishes the property of interest, i.e. lack of disjointness errors and coverage errors, respectively. To perform the disjointness checks, the following command is issued to Salsa:

salsa -c disj bombrel.sal (bombrel representing bomb release)

The response from Salsa is as follows:
Analyzing SAL specification in file: bombrel.sal.
Checking disjointness of all modules.
Checking module bombrel
Number of Nontrivial Atoms: 7
Checking BombRelease . . . (5,5,0):0 disjoint.
Checking ReadyStn . . . (1,1,0):0 disjoint.
Checking Weapons . . . (4,4,0):0 disjoint.
All checks passed.
Number of failed/passed verification conditions: 0/10
Total Time: 0.226
  Rewriting: 0.068
  Partitioning: 0.004
  Integer solving: 0.000
  Bdd ops (total,gc): 0.020, 0.000
BDD Statistics.
  Number of variables: 32
  Number of nodes
    User: 56
    Total: 190
  Table size: 65536

Based on the response from Salsa, it is concluded that there are no disjointness errors in the definitions of the variables "BombRelease", "ReadyStn", and "Weapons" as indicated above.

Subsequently, the specification is checked for coverage errors by issuing the following command:
salsa -c covg bombrel.sal The response from Salsa is as follows:
Analyzing SAL specification in file: bombrel.sal.
Checking coverage of all modules.
Checking module bombrel
Number of Nontrivial Atoms: 7
Checking BombRelease . . . (1,1,0):0 pass.
Checking ReadyStn . . . (1,1,0):0 pass.
Checking Weapons . . . (1,1,0):0 pass.
All checks passed.
Number of failed/passed verification conditions: 0/3
Total Time: 0.183
  Rewriting: 0.053
  Partitioning: 0.004
  Integer solving: 0.000
  Bdd ops (total,gc): 0.017, 0.000
BDD Statistics.
  Number of variables: 32
  Number of nodes
    User: 40
    Total: 135
  Table size: 65536

Based on the response from Salsa, we conclude that there are no coverage errors in the definitions of the variables "BombRelease", "ReadyStn", and "Weapons" as indicated above. By performing these checks, we can also conclude that the specification is well-formed and is free of errors, such as, syntax errors, type errors, disjointness errors, coverage errors, etc.

Salsa is subsequently instructed to determine whether the specification has the desired property, i.e., whether the following formula, (BombRelease=on)=> (ReleaseEnable=on), is an invariant of the specification. The following command is issued:

salsa -c guar -x -m bombrel -i OriginalReleaseOK bombrel.sal

Salsa generates the following output:
Analyzing SAL specification in file: bombrel.sal.
Checking guarantee: OriginalReleaseOK.
Number of Nontrivial Atoms: 7
Checking OriginalReleaseOK . . . (1,0,1):0-(1,0,0):1:5

Salsa provides the Counterexample as follows:
Unchanged integer variables:
  WeaponType, Overflown, MissDistance
Table of Concrete variable values:

| Variable | Old Value | New Value |
|---|---|---|
| TargetDesig | false | false |
| ReadyStn | false | false |
| ReleaseEnable | on | off |
| Stn1Ready | yes | yes |
| Stn8Ready | yes | yes |
| BombRelease | on | on |
| Weapons | None | None |
| ACAirborne | yes | yes |
| MasterFcnSwitch | natt | natt |

Additional Constraints:
1):0 fail.
Number of failed/passed verification conditions: 1/0
Total Time: 0.748
  Rewriting: 0.174
  Partitioning: 0.003
  Integer solving: 0.000
  Bdd ops(total,gc): 0.407, 0.000
BDD Statistics.
  Number of variables: 32
  Number of nodes
    User: 199
    Total: 3179
  Table size: 65536

It can be determined from the information, that the presumed invariant is not always true. In addition, the information alone does not assist users in determining what exactly is wrong in the specification. Salsa therefore provides a counterexample to assist the users in locating the source of the error. The counterexample returned by Salsa is in terms of values of variables in the "Old State" as well as the "New State" for a specific event, i.e., for a specific change to one of the variables monitored by the system. These values are conveniently presented in the table of concrete variable values described above. Referring to the table of concrete variable values above, Salsa is representing a situation in which variables "WeaponType", "OverFlown", and "MissDistance" remain unchanged. A situation where the above condition does not hold is when BombRelease and ReleaseEnable are both "on", and BombRelease remains "on" when ReleaseEnable goes "off". Therefore, Salsa has found a situation when BombRelease does indeed go "on" when ReleaseEnable is activated i.e., takes on the value "on", but is now representing a situation where BombRelease stays "on" when ReleaseEnable goes "off". This is a perfectly legitimate scenario since this is not violating the invariant, i.e., that BombRelease does not go "on" when ReleaseEnable is not "on". Therefore, the formulation of the presumed invariant was in error. From this, we can conclude that what is preferred to be established is the invariance of the following:

@T(BombRelease=on)=>(ReleaseEnable'=on)

which states that BombRelease ONLY GOES to "on" when ReleaseEnable is "on" and not otherwise. This property is verified by issuing the following command to Salsa:

salsa -c guar -m bombrel -i ModifiedReleaseOK -x bombrel.sal

Salsa returns the following messages which establishes the property as being true in all states, i.e., as an invariant of bombrel.

Analyzing SAL specification in file: bombrel.sal.
Checking guarantee: ModifiedReleaseOK.
Number of Nontrivial Atoms: 7
Checking ModifiedReleaseOK . . . (1,0,1):0-(1,1,0):0 pass.
Number of failed/passed verification conditions: 0/1
Total Time: 0.729
   Rewriting: 0.173
   Partitioning: 0.001
   Integer solving: 0.000
   Bdd ops (total,gc): 0.432, 0.000
BDD Statistics.
   Number of variables: 32
   Number of nodes
     User: 194
     Total: 3078
     Table size: 65536

The following exhibit provides the system input specifications and system input properties which are provided to Salsa in a language called SAL (SCR Abstract Language).

Exhibit A

```
module bombrel
functions
  /*==== Constant Declarations===========================*/
  /* 50 nmi X 6072 ft/nmi */
  k50nmi = 303600;
  /* 42 nmi X 6072 ft/nmi */
  k42nmi = 255024;
type definitions
  Distance: int in [0,k50nmi];
  MFSW : { natt, boc, ccip, tf, nattoff, bocoff, none };
  Switch : { on, off };
  WeapTyp : int in [0,99];
```

-continued

```
  YesNo : { yes, no };
  Weapons_type : { Nattack, CCIP, None };
monitored variables
  ACAirborne : YesNo;
  MasterFcnSwitch : MFSW;
  MissDistance : Distance;
  Overflown : Distance;
  ReleaseEnable : Switch;
  Stn1Ready : YesNo;
  Stn8Ready : YesNo;
  TargetDesig : bool;
  WeaponType : WeapTyp;
controlled variables
  BombRelease : Switch;
internal variables
  ReadyStn : bool;
  Weapons : Weapons_type;
guarantees
  OriginalReleaseOK = (BombRelease = on) => (ReleaseEnable = on);
  ModifiedReleaseOK = @T(BombRelease = on) =>
    (ReleaseEnable' = on);
definitions
  /*---- Begin event table: BombRelease -----------------------*/
  var BombRelease initially off :=
    case Weapons
      [ ] Nattack ->
         ev
           [ ] @T ((ReleaseEnable = on and MissDistance <= 10)) -> on
           [ ] @T ((ReleaseEnable = off)) -> off
         ve
      [ ] CCIP ->
         ev
           [ ] @T ((ReleaseEnable = on)) -> on
           [ ] @T ((ReleaseEnable = off)) -> off
         ve
      [ ] None ->
         ev
           [ ] never -> on
           [ ] never -> off
         ve
    esac
  /*---- Begin modeless condition table: ReadyStn ---------------*/
  var ReadyStn =
    if
      [ ] (Stn1Ready = yes or Stn8Ready = yes)
         and WeaponType != 0 -> true
      [ ] not (Stn1Ready = yes or Stn8Ready = yes)
         or WeaponType = 0 -> false
    fi
  /*---- Begin mode transition table: Weapons ------------------*/
  var Weapons initially None :=
    case Weapons
      [ ] Nattack ->
         ev
           [ ] @T ((TargetDesig and Overflown > 255024)) -> None
           [ ] @T ((MasterFcnSwitch = none)) -> None
         ve
      [ ] CCIP ->
         ev
           [ ] @T ((MasterFcnSwitch = none)) -> None
         ve
      [ ] None ->
         ev
           [ ] @T (
             (ACAirborne = yes and
                MasterFcnSwitch = natt and ReadyStn)) -> Nattack
           [ ] @T (
             (ACAirborne = yes and
                MasterFcnSwitch = ccip and ReadyStn)) -> CCIP
         ve
    esac
end module // bombrel
```

It will be appreciated that the present invention may be implemented in various forms of hardware, software or combinations thereof. An example of such an implementation may include one or more computers appropriately programmed, each computer having a processor, associated memory, an input section, an output unit and input/output control circuitry or interfaces for executing the elements of the invention. It will be appreciated that the processor can be a special purpose processor, a digital processor or a microprocessor.

Although the invention has been described above in relation to preferred embodiments thereof, it will be understood by those skilled in the art that variations and modifications can be effected in these preferred embodiments without departing from the scope and spirit of the invention.

What is claimed is:

1. An invariant checking method for determining whether a system property is an invariant of a system description, said method comprising the steps of:
    receiving a system description and a system property;
    transforming said system description and said system property into a model formula comprising variables;
    eliminating enumerated variables from said model formula and providing a corresponding output formula comprising zero or more integer constraints and residual variables remaining after eliminating said enumerated variables;
    partitioning said output formula into zero or more integer constraint subsets and into a logic formula by assigning a new logic variable for each of said zero or more integer constraints in said output formula;
    using a constrained binary decision diagram which is constructed from said logic formula using a heuristic algorithm to provide ordering of said logic variables, said constrained binary decision diagram having at least a true path or a false paths each path comprising said ordering of said logic variables;
    applying a constraint solver to at least one of said integer constraint subsets corresponding to said ordering of said logic variables within said true path; and
    determining said system property is not an invariant of the system when said at least one of said integer constraint subsets is satisfiable.

2. An invariant checking method according to claim 1, wherein said system description comprises SCR Abstract Language specifications.

3. An invariant checking method according to claim 2, wherein said receiving step comprises automatically generating said system property from said system description and determining whether said system property is consistent with said system description.

4. An invariant checking method according to claim 1, wherein said eliminating step comprises encoding enumerated variables as boolean variables.

5. An invariant checking method according to claim 4, wherein said applying step comprises constructing an automaton for said at least one of said integer constraint subsets corresponding to said ordering of said logic variables within said true path to determine whether said at least one of said integer constraint subsets is satisfiable.

6. An invariant checking method according to claim 5, wherein said determining step comprises generating a counterexample when said system property is not an invariant of the system description, said counterexample comprising a set of values assigned to variables in said model formula.

7. An invariant checking method according to claim 6, further comprising analyzing said counterexample in order to modify at least said system description or said system property.

8. An invariant checking method according to claim 7, comprising redetermining whether said system property is not an invariant of a modified system description.

9. An invariant checking method according to claim 7, comprising redetermining whether a modified system property is not an invariant of said system description.

10. An invariant checking method according to claim 7, comprising redetermining whether said modified system property is not an invariant of said modified system description.

11. An invariant checking method according to claim 1, further comprising determining whether said system property is an invariant of the system description when all of said zero or more integer constraint subsets are not satisfiable.

12. In a computer system comprising a processor, I/O control circuitry, an input unit, an output unit, a memory coupled to the processor, and a computer readable medium containing instructions which when executed by the processor causes the computer system to implement an invariant checking method, said computer system performs the steps of:
    receiving a system description and a system property;
    transforming said system description and said system property into a model formula comprising variables;
    eliminating enumerated variables from said model formula and providing a corresponding output formula comprising zero or more integer constraints and residual variables remaining after eliminating said enumerated variables;
    partitioning said output formula into zero or more integer constraint subsets and into a logic formula by assigning a new logic variable for each of said zero or more integer constraints in said output formula;
    using a constrained binary decision diagram which is constructed from said logic formula using a heuristic algorithm to provide ordering of said logic variables, said constrained binary decision diagram having at least a true path or a false path, each path comprising said ordering of said logic variables;
    applying a constraint solver to at least one of said integer constraint subsets corresponding to said ordering of said logic variables within said true path; and
    determining said system property is not an invariant of the system when said at least one of said integer constraint subsets is satisfiable.

13. An invariant checking apparatus for determining whether a system property is an invariant of a system based on system input descriptions, said invariant checking apparatus comprising:
    an input section for receiving a system description and a system property;
    a processor a computer readable medium coupled to said processor, the computer readable medium having instructions stored thereon which when executed cause the processor to perform the steps of:
    transforming said system description and said system property into a model formula comprising variables;
    eliminating enumerated variables from said model formula and providing a corresponding output formula comprising zero or more integer constraints and residual variables remaining after eliminating said enumerated variables;
    partitioning said output formula into zero or more integer constraint subsets and into a logic formula by assigning a new logic variable for each of said zero or more integer constraints in said output formula;

using a constrained binary decision diagram which is constructed from said logic formula using a heuristic algorithm to provide ordering of said logic variables, said constrained binary decision diagram having at least a true path or a false path, each path comprising said ordering of said logic variables;

applying a constraint solver to at least one of said integer constraint subsets corresponding to said ordering of said logic variables within said true path; and determining said system property is not an invariant of the system when said at least one of said integer constraint subsets is satisfiable; and an output unit showing a counterexample when said system property is not an invariant of said system description.

* * * * *